US007363900B2

(12) United States Patent
Griessbach et al.

(10) Patent No.: US 7,363,900 B2
(45) Date of Patent: Apr. 29, 2008

(54) MULTI-CYLINDER INTERNAL COMBUSTION ENGINE FOR VEHICLES

(75) Inventors: Robert Griessbach, Weyarn (DE); Robert Wagner, Kirchheim (DE); Andreas Werner, Munich (DE); Steffen Lutz, Karlsfeld (DE); Rolf Kruse, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 107 days.

(21) Appl. No.: 11/475,964

(22) Filed: Jun. 28, 2006

(65) Prior Publication Data

US 2007/0113816 A1 May 24, 2007

(30) Foreign Application Priority Data

Jun. 29, 2005 (DE) ...................... 10 2005 030 252

(51) Int. Cl.
*F01P 1/06* (2006.01)
*H05K 7/20* (2006.01)

(52) U.S. Cl. ............................ 123/184.21; 123/41.31; 123/195 C; 361/690

(58) Field of Classification Search ............ 123/41.31, 123/184.21, 184.61, 195 C, 198 E; 361/390
See application file for complete search history.

(56) References Cited

U.S. PATENT DOCUMENTS

| | | | | |
|---|---|---|---|---|
| 5,713,322 | A | 2/1998 | Mausner et al. | |
| 6,357,414 | B1 | 3/2002 | Kalinowski et al. | |
| 6,408,811 | B1 * | 6/2002 | Glovatsky et al. | 123/184.61 |
| 6,675,755 | B2 * | 1/2004 | Glovatsky et al. | 123/184.21 |
| 6,788,534 | B2 * | 9/2004 | Kinoshita et al. | 361/690 |
| 6,925,980 | B2 * | 8/2005 | Glovatsky | 123/184.21 |
| 7,113,400 | B2 * | 9/2006 | Nagata et al. | 123/41.31 |
| 2002/0179025 | A1 | 12/2002 | Glovatsky | |

FOREIGN PATENT DOCUMENTS

| | | | |
|---|---|---|---|
| DE | 43 44 027 | A1 | 6/1995 |
| DE | 44 03 219 | A1 | 8/1995 |
| EP | 0 674 100 | A1 | 9/1995 |
| JP | 4-203437 | A | 7/1992 |
| JP | 2004-239211 | A | 8/2004 |

OTHER PUBLICATIONS

German Search Report dated Jan. 16, 2006 including English Translation of relevant portion (Nine (9) pages).
German Search Report dated Nov. 14, 2006 with the English translation of the relevant portion (Eight (8) Pages).

* cited by examiner

*Primary Examiner*—Noah P. Kamen
(74) *Attorney, Agent, or Firm*—Crowell & Moring LLP

(57) ABSTRACT

In a multi-cylinder internal combustion engine for vehicles, having a plurality of air ducts leading to the cylinders and an associated engine control device situated in a housing, the air ducts are combined into a single unit, on the exterior of which the engine control device housing is situated on its lower part which forms the underside, and the lower part of the engine control device housing simultaneously forms a part of the air ducts.

18 Claims, 2 Drawing Sheets

MULTI-CYLINDER INTERNAL COMBUSTION ENGINE FOR VEHICLES

BACKGROUND AND SUMMARY OF THE INVENTION

This application claims the priority of German Application No. 10 2005 030 252.1, filed Jun. 29, 2005, the disclosure of which is expressly incorporated by reference herein.

The invention relates to a multi-cylinder internal combustion engine for vehicles, having a plurality of air ducts leading to the cylinders and an associated engine control device situated in a housing.

A generic internal combustion engine is known from DE 44 03 219 A1, in which the air ducts leading to the cylinders and the associated engine control device are situated in a three-part housing. Two parts are designed as half-shells to which the contours of each of the air ducts, divided along a meridian surface, conform. The engine control device housing is situated in the third part. Additional sections of the air ducts also run therein.

It is also known from EP 0 674 100 A1 to combine the air ducts into a single unit, and to provide on the exterior thereof or in a cavity provided therein the switch box, i.e., the combination of all or at least a majority of the connecting plugs for the lines leading to the controllers, switches, actuators, sensors, and the like for the entire vehicle. More detailed information about the structural design of the unit and the switch box has not been published.

A disadvantage of internal combustion engines of the above-mentioned type is that the housing requires a relatively large amount of space and significant sealing measures, for example in the region of the half-shells. The housing contains a comparatively large number of individual parts, and is costly to manufacture in mass production.

There is therefore needed an internal combustion engine having the simplest and most compact design possible.

These and other needs are met by providing a multi-cylinder internal combustion engine for vehicles, having a plurality of air ducts leading to the cylinders and an associated engine control device situated in a housing. The air ducts are combined into a single unit, on the exterior of which the engine control device housing is situated on its lower part. A plurality of circuit boards are provided on the lower part, and the lower part and/or the circuit boards are adapted to the exterior shape of the air ducts so that the circuit boards are inclined with respect to one another.

The wall formed between the air ducts and the adjacent engine control device housing thus serves a double purpose. It forms a component of the engine control device housing and the air ducts, thereby simplifying the design and reducing the weight and the cost of the entire unit comprising the engine control device housing and the air ducts.

One advantage of the internal combustion engine according to the invention is that special sealing measures along the air ducts are omitted. The common use of the lower part of the engine control device housing as a part of the air ducts further economizes in weight and cost. The arrangement of the control device at the air ducts also results in a compact design.

A further advantage of the internal combustion engine according to the invention is the possibility of performing a complete function test of the internal combustion engine before it is installed in the vehicle.

In one embodiment of the invention, the circuit boards are electrically connected to one another by way of multi-strand ribbon cables. This results in a particularly simple and economical design.

In a further aspect of the invention, the circuit boards are detachably connected to the lower part of the housing. This provides a particularly simple possibility to replace the "heart" of the control device with a circuit board containing a microprocessor.

In another aspect of the invention, the circuit boards have a thermally-conducting connection with the lower part of the housing. An advantage of this embodiment is that special cooling measures for the control device may be omitted.

Further advantages and embodiments of the invention make use of connecting plugs for the circuit boards that are incorporated in the housing. Moreover, a lower part of the engine control device housing may simultaneously form a part of the air ducts.

These and other advantages and embodiments essentially serve to simplify the design and further reduce the manufacturing and maintenance costs.

Other objects, advantages and novel features of the present invention will become apparent from the following detailed description of the invention when considered in conjunction with the accompanying drawings.

DETAILED DESCRIPTION OF THE DRAWINGS

Figure 1:
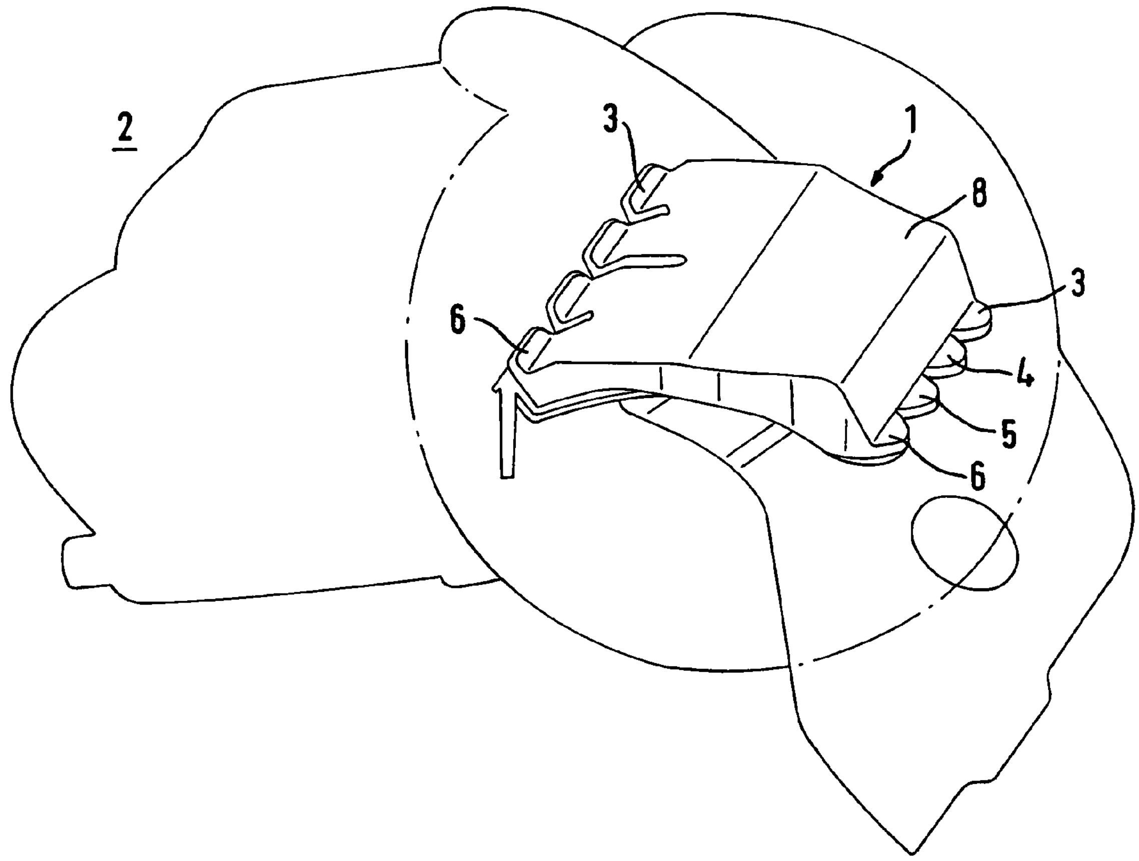
FIG. 1 is a perspective illustration of an intake manifold of a multi-cylinder internal combustion engine according to the present invention.
Figure 2:
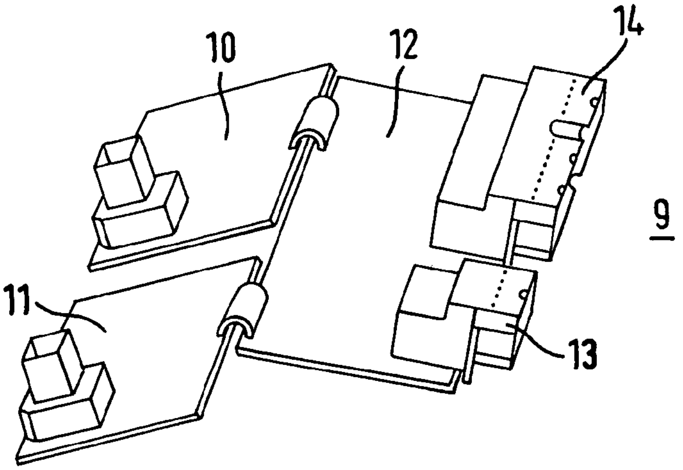
FIG. 2 is a perspective view of an electronic control device 9 of the internal combustion engine.
Figure 3:
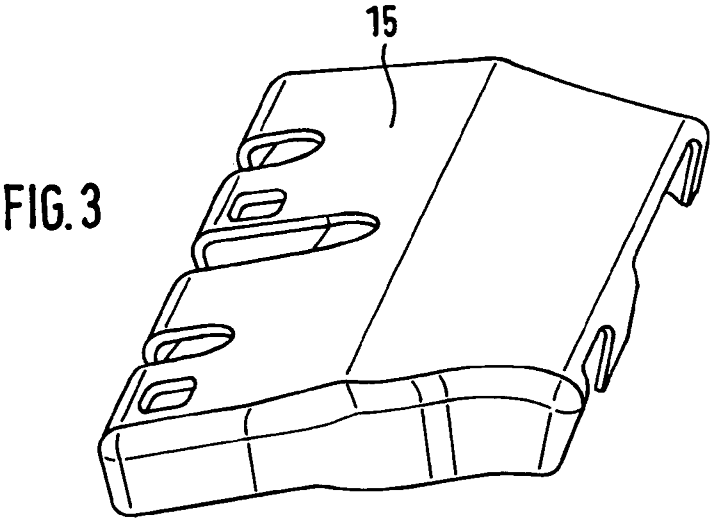
FIG. 3 is a perspective view of a cover for the electronic control device of FIG. 2.

FIGS. 1 through 3 show a section of the design of the internal combustion engine according to the invention by way of perspective illustrations.

FIG. 1 shows a perspective illustration of the intake manifold 1 of a multi-cylinder internal combustion engine 2, which essentially includes four adjacent air ducts 3-6. These air ducts conduct air led through a filter, the outlet 7 of which is illustrated, to four cylinders (not shown).

Figure 1A:
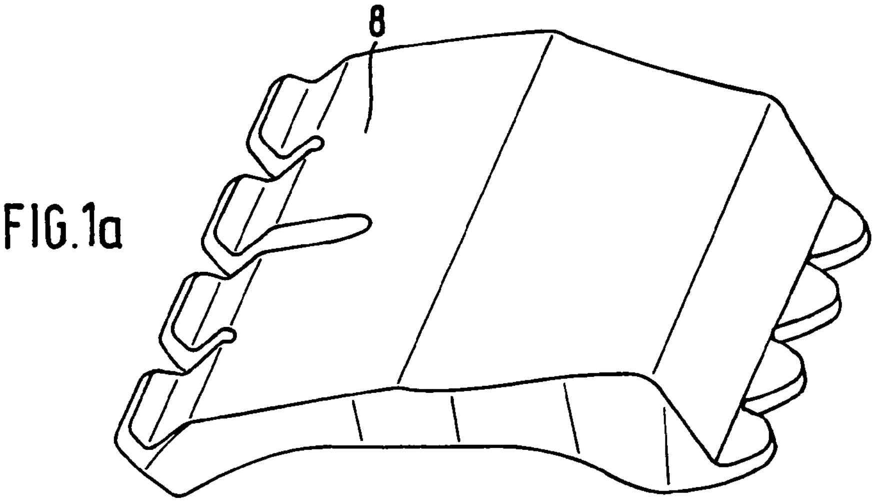
FIG. 1*a* is a separate illustration of the upper part of the intake manifold of FIG. 1 according to the present invention.

The intake manifold essentially includes two housing parts, a lower part (not illustrated) and an upper part 8. The upper part 8 is illustrated separately in FIG. 1*a* and represents the underside of a likewise two-part housing for an electronic control device 9 of the internal combustion engine 2, which electronic control device 9 is shown in FIG. 2.

The control device 9 with its essential components is illustrated in FIG. 2. The control device contains printed circuit boards 10 and 11 for controlling ignition and injection of the internal combustion engine, as well as a cooperating processor board 12. The processor board carries multiple connectors 13 and 14 for connecting the board 12 to the electrical distribution system of the vehicle (not illustrated).

The housing for the control device 9 contains, as a second housing part, a cover 15, which is illustrated in FIG. 3. The cover 15 closes off the control device 9 and accommodates the connectors 13 and 14 between the two parts 8 and 15.

A majority of the power loss from the electronic control device 9 originates at the (not illustrated) end stages for the injection and ignition stage drivers, which are situated on the printed circuit boards 10 and 11 for individual cylinders. For cooling the affected components, these printed circuit boards are thermally coupled to the air ducts 3-6, which cool the air drawn in by the engine. As the result of the frequent ignition and injection operations, a high power loss occurs at higher engine rotational speeds which, however, is well dissipated by the large mass of air drawn in by the engine.

The printed circuit boards 10 and 11 for controlling ignition and injection are situated close to the cylinder head of the internal combustion engine 2, resulting in very short line lengths to the ignition coils and the injection valves (not illustrated). This is very advantageous for electromagnetic compatability and cable routing. Connection of the electronic modules 10-12 to the parts 8 and 15 by way of ribbon cables (not shown) inside the housing results in an economical, modular solution. In this housing the ribbon cables are protected from the effects of moisture, and from considerable thermal influences as a result of the cooling effect of the air drawn in by the engine.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A multi-cylinder internal combustion engine for vehicles, comprising:

a plurality of air ducts leading to cylinders of the multi-cylinder internal combustion engine;

a housing in which is arranged an engine control device for the multi-cylinder internal combustion engine;

wherein the plurality of air ducts are combined into a single housing unit, an exterior of the single housing unit for the plurality of air ducts forming a lower part of the housing for the engine control device; and a plurality of circuit boards of the engine control device being provided on the lower part, wherein at least one of the lower part and the plurality of circuit boards are adapted to an exterior shape of the air ducts such that the plurality of circuit boards are inclined with respect to one another.

2. The internal combustion engine according to claim 1, wherein the circuit boards are electrically connected to one another by multi-strand ribbon cables.

3. The internal combustion engine according to claim 2, wherein the circuit boards are detachably connected to the lower part of the housing.

4. The internal combustion engine according to claim 3, wherein the circuit boards are thermally-coupled with the lower part.

5. The internal combustion engine according to claim 2, wherein the circuit boards are thermally-coupled with the lower part.

6. The internal combustion engine according to claim 5, further comprising connecting plugs for the circuit boards, the connecting plugs being incorporated in the housing.

7. The internal combustion engine according to claim 5, wherein the lower part of the engine control device housing simultaneously forms a part of the air ducts.

8. The internal combustion engine according to claim 2, further comprising connecting plugs for the circuit boards, the connecting plugs being incorporated in the housing.

9. The internal combustion engine according to claim 1, wherein the circuit boards are detachably connected to the lower part of the housing.

10. The internal combustion engine according to claim 9, wherein the circuit boards are thermally-coupled with the lower part.

11. The internal combustion engine according to claim 9, wherein the lower part of the engine control device housing simultaneously forms a part of the air ducts.

12. The internal combustion engine according to claim 1, further comprising connecting plugs for the circuit boards, the connecting plugs being incorporated in the housing.

13. The internal combustion engine according to claim 1, wherein the lower part of the engine control device housing simultaneously forms a part of the air ducts.

14. A housing for an engine control device of a multi-cylinder internal combustion engine, the housing comprising:

a lower part having a first surface on which a plurality of circuit boards of the engine control device are arranged, the lower part having an opposing surface forming a part of a plurality of air ducts operatively configured to lead to cylinders of the internal combustion engine;

a cover operatively configured to form an upper part of the housing, the cover adjoining the lower part so as to substantially enclose the plurality of circuit boards; and wherein at least one of the lower part of the housing and the circuit boards are adapted to an exterior shape of the plurality of air ducts such that the circuit boards are inclined with respect to one another in the housing.

15. The housing according to claim 14, wherein the plurality of circuit boards are electrically coupled to one another via multi-strand ribbon cables.

16. The housing according to claim 14, wherein the plurality of circuit boards are detachably coupled to the lower part.

17. The housing according to claim 14, wherein the plurality of circuit boards are thermally coupled with the lower part.

18. The housing according to claim 14, further comprising connecting plugs for the plurality of circuit boards, the connecting plugs being incorporated into the housing.

* * * * *